(12) United States Patent
Hishida

(10) Patent No.: US 6,861,802 B2
(45) Date of Patent: Mar. 1, 2005

(54) ORGANIC ELECTROLUMINESCENCE PANEL

(75) Inventor: Mitsuoki Hishida, Gifu (JP)

(73) Assignee: Sanyo Electric Co., Ltd. (JP)

(*) Notice: Subject to any disclaimer, the term of this patent is extended or adjusted under 35 U.S.C. 154(b) by 0 days.

(21) Appl. No.: 10/401,713

(22) Filed: Mar. 27, 2003

(65) Prior Publication Data

US 2003/0230978 A1 Dec. 18, 2003

(30) Foreign Application Priority Data

Mar. 28, 2002 (JP) ........................................ 2002-091942

(51) Int. Cl.⁷ ................................................ G09C 3/20
(52) U.S. Cl. ........................ 313/512; 313/504; 257/682
(58) Field of Search ................................ 313/512, 504, 313/506, 545, 546, 553, 561; 257/682, 545, 546, 553, 561; 315/169.3

(56) References Cited

U.S. PATENT DOCUMENTS

| | | | |
|---|---|---|---|
| 6,081,071 A | * | 6/2000 | Rogers ........................ 313/512 |
| 6,265,820 B1 | * | 7/2001 | Ghosh et al. ................ 313/483 |
| 6,520,821 B1 | * | 2/2003 | Ishii et al. .................... 445/25 |
| 2003/0039859 A1 | * | 2/2003 | Ohata ........................... 428/690 |
| 2003/0164681 A1 | * | 9/2003 | Fukuoka et al. ............. 313/512 |
| 2003/0173895 A1 | * | 9/2003 | Kato et al. ................... 313/504 |
| 2003/0209980 A1 | * | 11/2003 | Sasatani et al. ............. 313/553 |

* cited by examiner

*Primary Examiner*—Vip Patel
*Assistant Examiner*—Glenn Zimmerman
(74) *Attorney, Agent, or Firm*—Cantor Colburn LLP

(57) ABSTRACT

A sealing substrate is disposed opposite an EL substrate. A frame in the peripheral portion of the sealing substrate is connected to the peripheral portion of the EL substrate to seal off an inner space. A desiccant (moisture absorbent) is provided on the inner space of the sealing substrate. Further, the thickness of the desiccant is smaller in a region distant from the frame (near the center of the substrate) than in a region near the frame, thereby preventing contact between the desiccant and the EL substrate.

15 Claims, 6 Drawing Sheets

ORGANIC ELECTROLUMINESCENCE PANEL

BACKGROUND OF THE INVENTION

1. Field of the Invention

The present invention relates to organic electroluminescence (EL) panels, and more particularly to an organic EL panel provided with a moisture absorbent for drying the space above organic EL pixels.

2. Description of the Related Art

Organic EL panels represent a type of flat display panel under active development. In an organic EL panel, an organic EL element is used for each pixel. This represents a disadvantage because such organic EL elements are relatively easily degraded by moisture.

To deal with this disadvantage, it is common for a surface of an organic EL substrate having organic EL elements arranged thereon in a matrix to be covered with a concave sealing substrate, to seal off the space above the organic EL elements and prevent the entry of moisture. Additionally, in order to remove any moisture entering inside, it is common for a moisture absorbent to be applied on an inner upper surface of the sealing substrate.

EL substrates and sealing substrates are usually formed of glass, and reduction in thickness of such substrates is desirable in view of their weight, size, and the like. With a thin substrate, the tendency to flex when a weight is applied thereto increases significantly.

When the substrate is flexed, the EL element formed on the EL substrate may be brought into contact with the moisture absorbent. Because the EL element is generally composed of an organic layer including an emissive layer between an anode and a cathode, and the cathode is often located at the upper surface of the EL element, the cathode is most likely to contact the moisture absorbent, and, because of its reduced thickness, damage is likely.

SUMMARY OF INVENTION

The present invention can provide an organic EL panel capable of suppressing adverse effects of panel flexure.

According to one aspect of the present invention, an organic EL panel comprises an EL substrate having a plurality of organic EL pixels formed thereon; a sealing substrate disposed opposite said EL substrate, and having a peripheral portion connected to a peripheral portion of said EL substrate and an inner region covering a pixel region where said plurality of organic EL pixels are formed, said inner region separated from said pixel region by a predetermined distance; and a moisture absorbent applied on an upper surface of the inner region of said sealing substrate, wherein said moisture absorbent is provided with a thickness smaller in a region distant from said peripheral portion than in a region near said peripheral portion in the upper surface of said inner region.

According to another aspect of the present invention, in the above organic EL panel, said sealing substrate is a concave substrate projecting in the peripheral portion bonded to said EL substrate, and depressed in the inner region corresponding to said pixel region of said EL substrate.

Thus, the thickness of the moisture absorbent in the inner region (the region distant from the peripheral portion connected to the EL substrate) is reduced, thereby maintaining a relatively large distance between the EL substrate and the sealing substrate. While the moisture absorbent is disposed with a thickness larger in a inner region than in the outer region, deformation is small in the outer region, so that contact between the moisture absorbent and the EL substrate due to flexure can efficiently be prevented.

According to a further aspect of the present invention, in the above organic EL panel, said moisture absorbent is provided in regions corresponding to a region near said peripheral portion and in regions corresponding to a central portion of said EL substrate, and having a thickness reduced toward said central portion.

Also in such a configuration where the moisture absorbent is disposed in a central region, contact between the moisture absorbent and the EL substrate can be prevented while maintaining sufficient moisture absorbing function by reducing the thickness of the moisture absorbent in this region as compared with that in the peripheral portion.

According to a further aspect of the present invention, in the above organic EL panel, said moisture absorbent is continuously provided in a spiral pattern extending from said central portion to said peripheral portion.

Such a spiral configuration of the moisture absorbent allows a moisture absorbent having a large surface area to be disposed in a minimum area.

According to a further aspect of the present invention, an organic EL panel comprises an EL substrate having a plurality of organic EL pixels formed thereon; a sealing substrate disposed opposite to said EL substrate, and having a peripheral portion connected to a peripheral portion of said EL substrate, and an inner region covering a pixel region where said plurality of organic EL pixels are formed, the substrates being separated by a predetermined distance therebetween; and a moisture absorbent applied over an upper surface of the inner region of said sealing substrate, wherein said moisture absorbent is provided only in a region near said peripheral portion, and not provided in a region distant from said peripheral portion.

Further, said moisture absorbent provided over the upper surface of the sealing substrate can be provided with a thickness smaller in a region distant from said peripheral portion than in a region closer to said peripheral portion.

According to a further aspect of the present invention, in the above organic EL panel, said moisture absorbent is provided with a thickness reduced as it becomes distant from said peripheral portion.

According to a further aspect of the present invention, in the above organic EL panel, said moisture absorbent is provided in a continuous spiral pattern extending from a central portion side of said EL substrate to said peripheral portion.

As a result, a moisture absorbent having a large surface area can be efficiently provided in a limited area and with a simple structure.

As described above, because the moisture absorbent is not provided in the inner region, a large distance between the EL substrate and the sealing substrate can be maintained in this region. In addition, in an organic EL panel emitting light from the sealing substrate side to outside, the moisture absorbent can be provided on the sealing substrate without blocking light from the organic EL element, thereby preventing degradation due to moisture.

DESCRIPTION OF PREFERRED EMBODIMENTS

Preferred embodiments of the present invention will now be described with reference to the accompanying drawings.

Figure 1A:
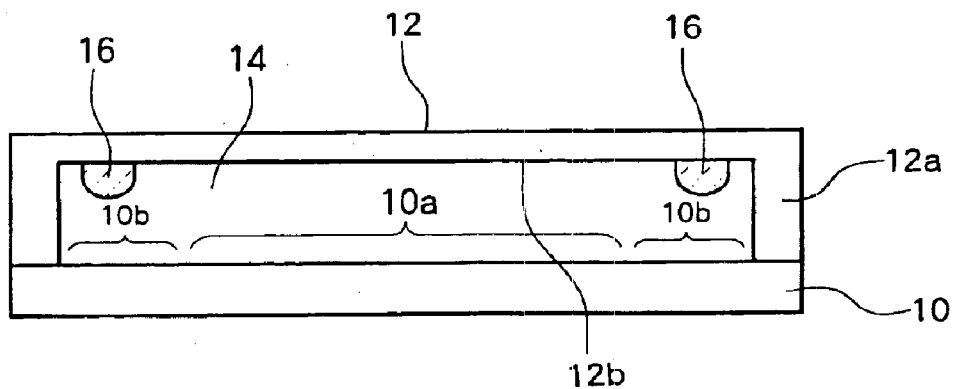
FIGS. 1A and 1B are front cross sectional views schematically illustrating a configuration of a first embodiment according to the present invention.
Figure 1B:
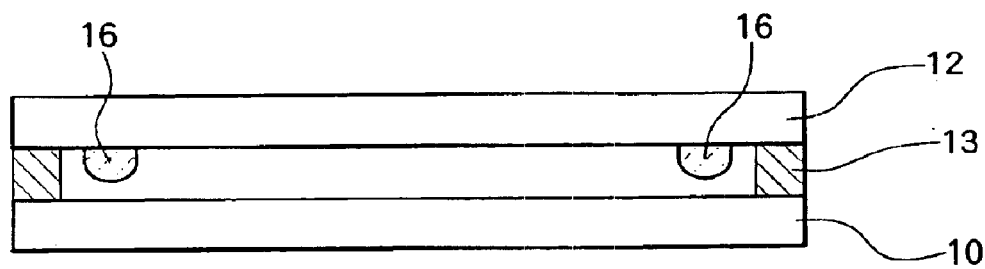
Figure 2:
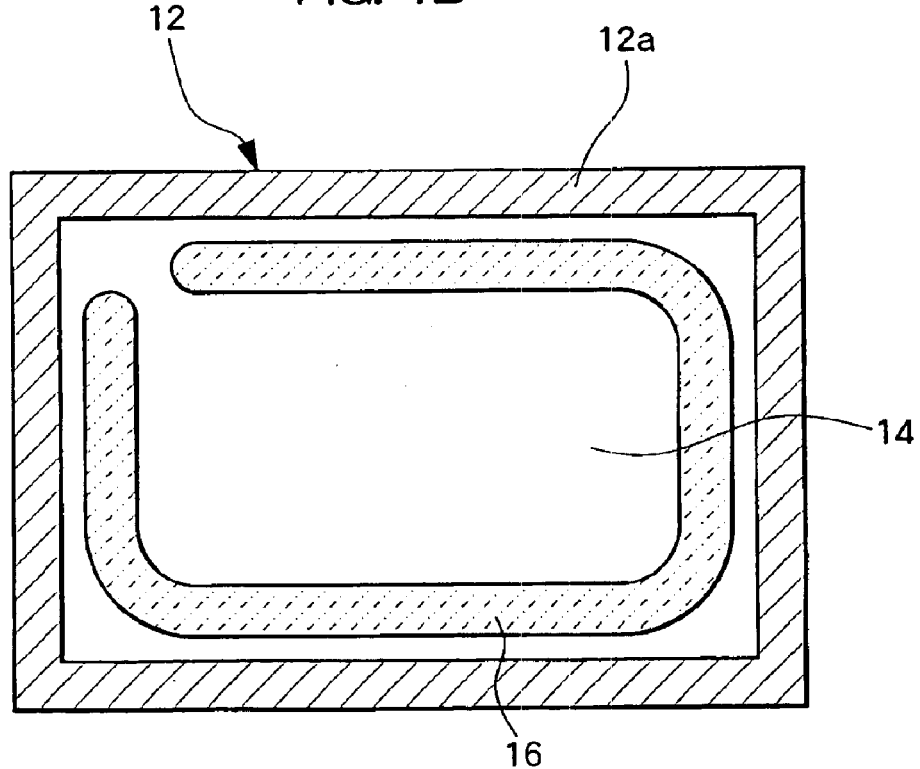
FIG. 2 illustrates a configuration of a sealing substrate in the first embodiment.

FIGS. 1A and 1B and FIG. 2 schematically illustrate a configuration of one embodiment according to the present invention. Referring to FIG. 1A, on an EL substrate 10 a concave sealing substrate 12 is disposed such that only the peripheral portion contacts the substrate 10, and such that an inner portion located above the substrate provides a predetermined distance between the substrates. In other words, the peripheral portion of the sealing substrate 12 is formed as a frame 12a projecting toward the EL substrate 10, and only the tip portion of the frame 12a contacts the surface of the EL substrate 10. The contacting portion is bonded to the substrate with a sealing agent, thereby sealing an inner space 14 off from the outside. The concave portion of the sealing substrate 12 is provided corresponding to the region where a plurality of display pixels including the organic EL elements formed on the EL substrate 10 are formed. The sealing substrate is not limited to a concave shape, and a flat substrate may also be used, as illustrated in FIG. 1B. For the flat substrate, the sealing agent applied at a portion 13 bonded to the EL substrate 10 is preferably mixed with, for example, spacer particles in order to maintain a sufficient distance between the sealing substrate 12 and the EL substrate 10.

Referring to FIG. 2, a desiccant 16, a moisture absorbent, is applied along a region of an upper surface 12b of the sealing substrate 12 within the space 14 inside the frame 12a, but relatively closer to the periphery of the substrate. Particularly, the desiccant 16 is applied only in the region (outer region) of the inner upper surface of the sealing substrate 12, located near the frame 12a (peripheral portion). That is, the desiccant 16 is not provided in the central (inner) region of the sealing substrate relatively distant from the frame 12a disposed in the peripheral portion.

In this example, the desiccant 16 is applied onto the sealing substrate 12 in the form of a continuous belt by, for example, moving the applicator relative to the substrate. The opposing ends are spaced apart from each other because the overlapping portion of the desiccant 16 increases the height, thereby maintaining a fixed height.

Generally, the sealing substrate 12 having the desiccant 16 applied thereon is bonded and sealed to the EL substrate 10 with a sealing material in an inert gas atmosphere including, for example, dry nitrogen or argon, after a driver circuit, EL elements, and the like are formed on the EL substrate 10.

Alternatively to the above method of applying the desiccant 16 from a tube, a sticker type desiccant with an adhesive preapplied to one side may be used. The sticker type desiccant 16 is formed in a predetermined size, and applied in the required region. When such a sticker type desiccant 16 is used, it is similarly disposed in the concave region of the sealing substrate 12 located nearer the peripheral portion.

Thus, the inner space 14 tightly shut off by the sealing substrate 12 is maintained in a dry state due to the effects of the desiccant 16, thereby efficiently preventing entry of moisture into the EL elements from the inner space 14.

In the EL substrate 10 composed of various circuit EL elements provided on a glass substrate, multiple pixels including EL elements are disposed in a matrix to form a display area 10a. In the present embodiment, driver circuits disposed in row and column directions for driving the display area 10, and a portion connecting to the outside are formed in the vicinity of the display area 10a. Such an area will be hereinafter referred to as a driver region 10b. To the connecting portion, a flexible printed circuit (FPC) substrate is connected from the outside.

Each pixel generally includes a switching thin film transistor (TFT), a storage capacitor, a driving TFT, and an organic EL element. By turning on the switching TFT, a data potential from a data line is stored in the storage capacitor, and the driving TFT is turned on in accordance with the potential stored in the storage capacitor, thereby supplying a current from a power source line to the EL element, which then emits light. There are many possible variations of such a pixel circuit.

The organic EL element is composed of a transparent anode of ITO or the like formed on the glass substrate, a hole transportation layer, an organic emissive layer, an electron transportation layer, and a cathode, successively stacked thereon. The cathode is formed covering the entire display area.

In such an organic EL panel, the distance between the EL substrate 10 and the sealing substrate 12 is maintained by the frame 12a and gas enclosed in the space. The panel, however, maybe flexed by application of an external force. More specifically, when an external force is applied in the direction bringing the EL substrate 10 and the sealing substrate 12 closer to each other, the distance between the substrates 10 and 12 is reduced. In this state, the flexure amount tends to increase toward the central regions of the EL substrate 10 and the sealing substrate 12.

In the present embodiment, the desiccant 16 is provided away from the central region, so that the desiccant 16 is less likely to contact the cathode of the EL substrate 10 to efficiently prevent damage of the cathode or the like.

Figure 3:
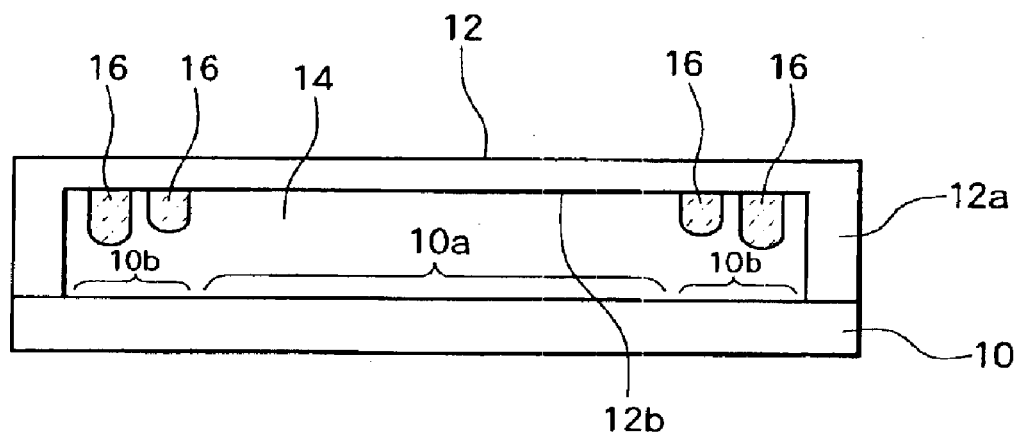
FIG. 3 is a front cross sectional view schematically illustrating a configuration of another embodiment according to the present invention.
Figure 4:
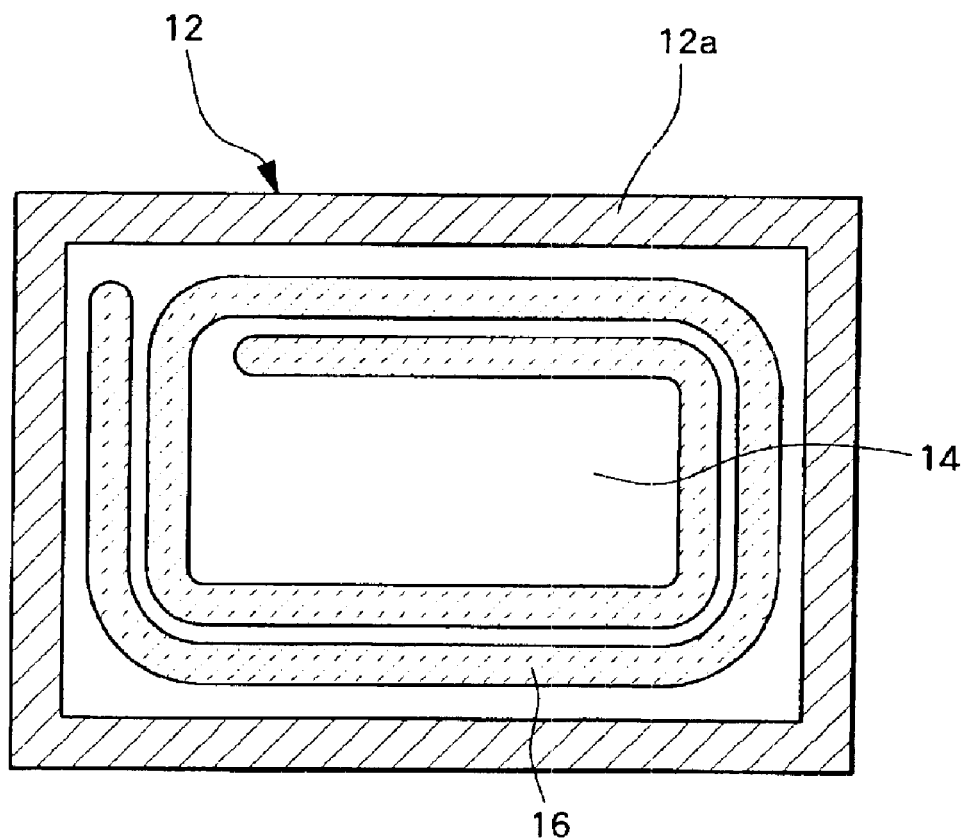
FIG. 4 illustrates a configuration of a sealing substrate in the embodiment illustrated in FIG. 3.

FIGS. 3 and 4 illustrate another preferred embodiment of the present invention. In this further example, the inner desiccant 16 has a decreased height, as illustrated in FIG. 3, and no desiccant is provided on the inner side thereof. Further, the desiccant 16 is provided in a twice-wound spiral. By thus gradually decreasing the height of the desiccant 16 toward the inner side, the desiccant 16 can be prevented from contacting the EL substrate 10 while increasing the amount thereof.

Figure 5:
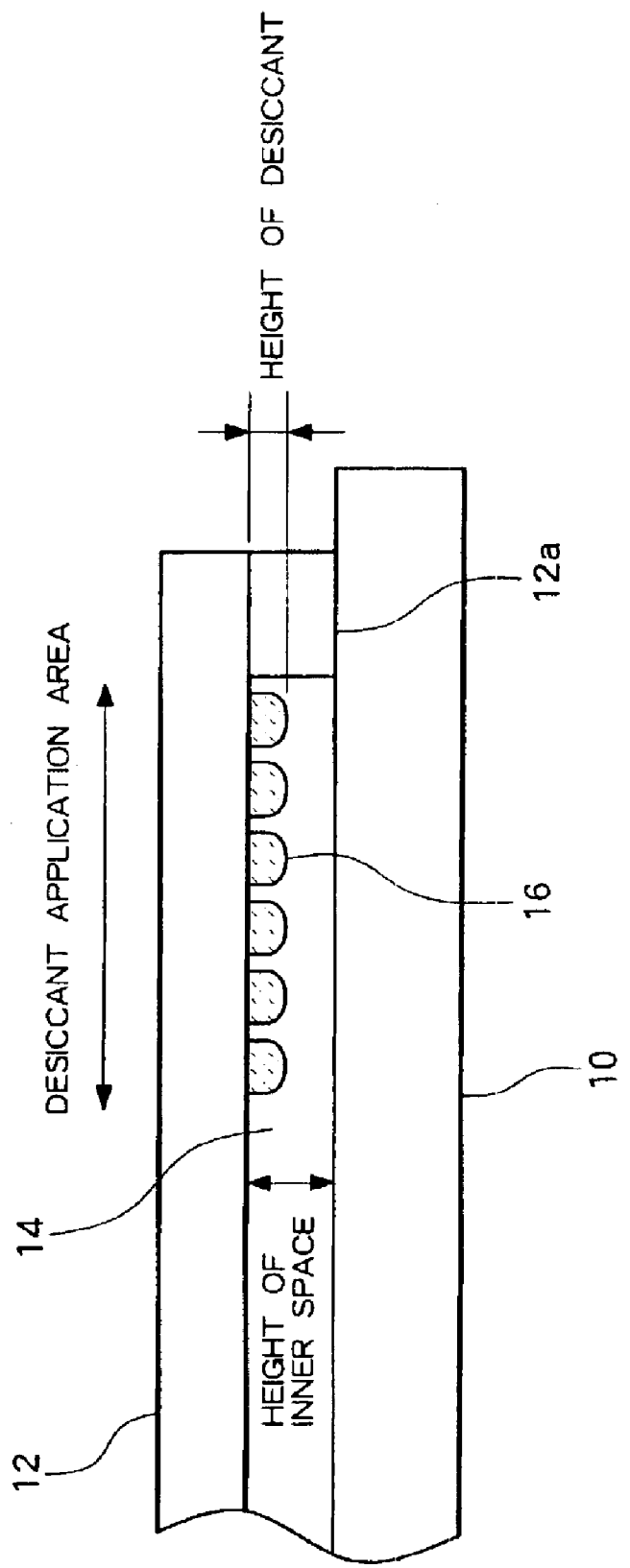
FIG. 5 is a cross sectional view schematically illustrating key components of a configuration of a still further embodiment according to the present invention.

FIG. 5 schematically illustrates an alternative arrangement of the desiccant 16 in a 15-inch EL panel. By way of example, the dimensions of the panel are set such that the thickness of the EL substrate 10 is approximately 0.7 mm, the overall thickness of the sealing substrate 12 is approximately 1 mm, and the height of the inner space 14 is approximately 0.3 mm. In this configuration, the desiccant 16 is provided with a height of 0.2 mm, a width of 0.2 mm, spacing between the adjacent columns of approximately 0.1 mm, and an overall length of approximately 50 mm, covering about 15 to 20 columns.

Thus, the desiccant 16 is not provided in the central region, and an inner space 14 height of 0.3 mm can be achieved. Although the height of the inner space 14 is 0.1 mm along the peripheral portion, because this portion is relatively near the frame deformation is much less likely. Consequently, contact between the desiccant 16 and the EL substrate 10 due to flexure can efficiently be prevented.

While a variety of moisture adsorbents (absorbents) can be used for the desiccant 16, preferable adsorbents include zeolite and silica gel.

Figure 6:
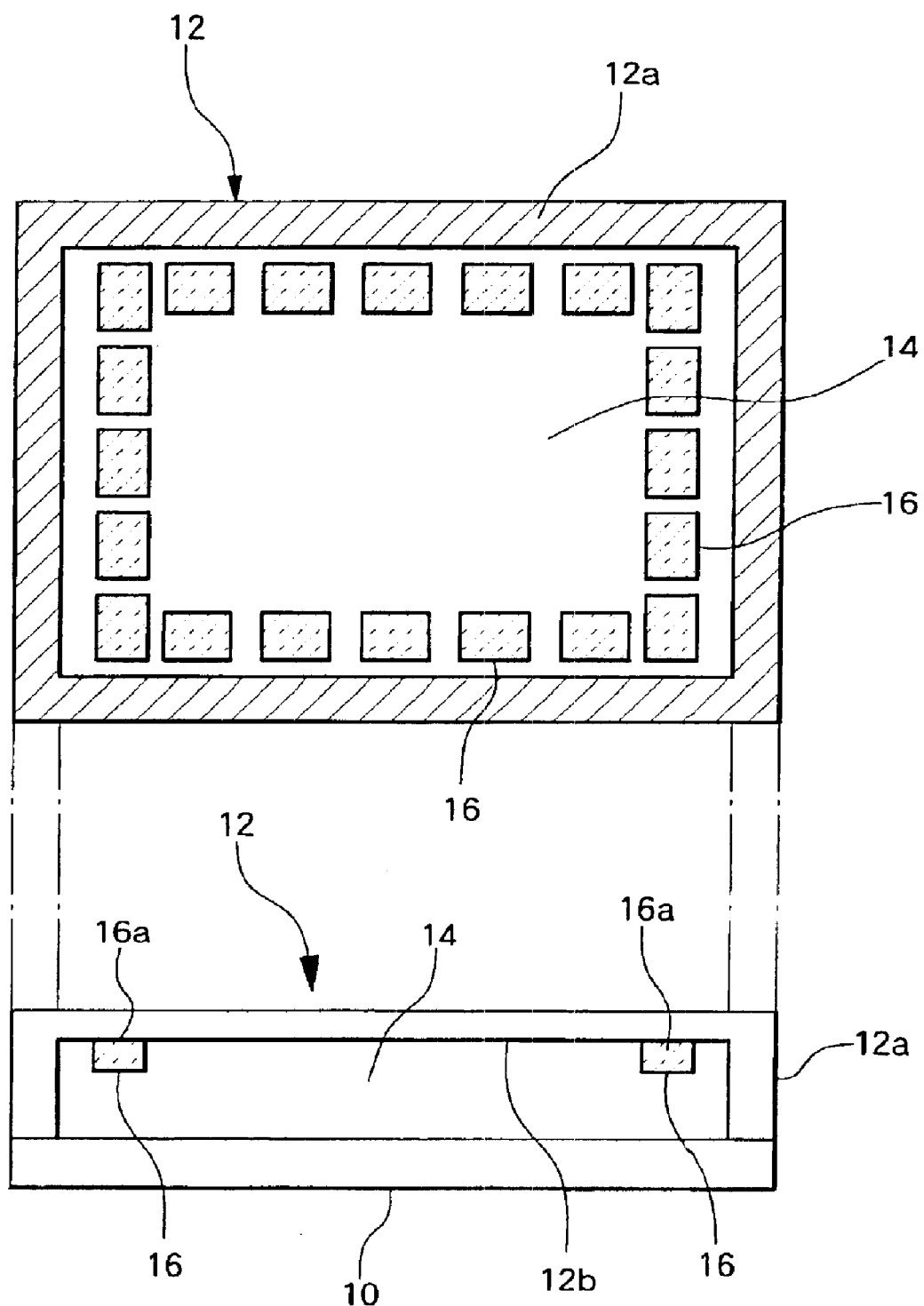
FIG. 6 is a cross sectional view schematically illustrating a configuration of the further embodiment according to the present invention.

FIG. 6 illustrates an exemplary configuration in which a sticker type desiccant 16 is used. As illustrated, multiple desiccants 16 of a predetermined shape are arranged along the frame 12a in the region of the concave upper surface 12b of the sealing substrate 12 adjacent to the frame 12a. This sticker type desiccant includes an adhesive preapplied on one surface, and can be attached simply by peeling off a protective seal or sticker. Although a single column of the sticker type desiccants 16 is provided in this example, the sticker type desiccants 16 may be configured in a plurality of columns. With a plural column configuration, it is similarly preferable to provide the inner desiccant 16 with a reduced thickness. While the thicker desiccant 16 may be formed by stacking sticker type desiccants, desiccants of various thicknesses may preferably be used.

As described above, no desiccant 16 is provided in the central region of the sealing substrate 12, or the desiccant 16 is provided with a thickness reduced toward the central region, thereby further ensuring prevention of contact between the EL substrate 10 and the desiccant 16 in the central region of the substrate where the substrate flexes more remarkably. Further, contact between the display area 10a, where damage directly results in display defect, and the desiccant 16 can be prevented to a greater degree by providing no desiccant 16 in the display area 10a, as illustrated in FIG. 1A and FIG. 3.

Figure 7:
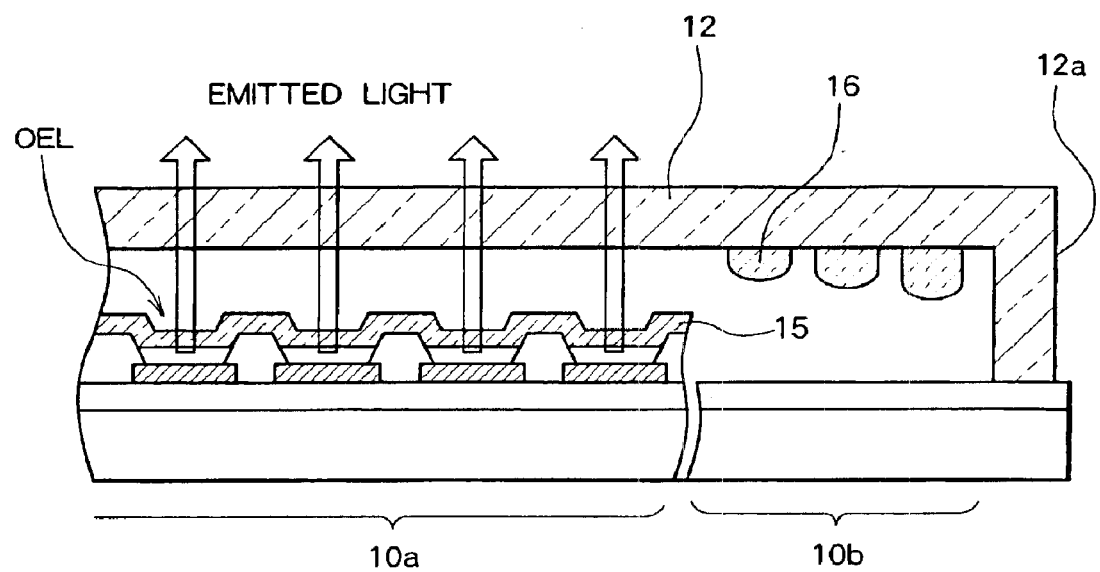
FIG. 7 is a cross sectional view schematically illustrating key components of a top emission type organic EL panel according to an embodiment of the present invention.

In a so-called top emission type organic EL display device in which light is emitted from the "opposite" side (the sealing substrate 12 side) of the EL substrate, it is preferable that no desiccant 16 be provided in the region of the sealing substrate 12 corresponding to the display area 10a of the EL substrate 10. Referring to FIG. 7, in a top emission type organic EL display device, a transparent electrode of indium tin oxide (ITO) or the like is used as an upper electrode 15 of an organic EL element (indicated as OEL in the figure), so that light is transmitted through the upper electrode and emitted outside from the sealing substrate 12 of transparent glass or the like. Consequently, the desiccant 16, which typically has a low optical transmittance, must not be provided in such a light emission region. On the other hand, it is also required to absorb moisture with the desiccant 16 in the inner space 14, and therefore the desiccant 16 is preferably provided near the driver region 10b located in the vicinity of the display area 10a, as illustrated in FIG. 7. The surface area of the desiccant 16 can be increased by forming the desiccant in a convoluted (spiral) pattern in which the desiccant 16 is wound a plurality of times, as illustrated in FIG. 4, as compared with the pattern in FIG. 1A, and the desiccant 16 arranged in a limited region can thereby be with a higher moisture absorbing efficiency, depending on the accuracy of the desiccant application process and the size of the area outside the display area 10a in which the desiccant can be provided.

Figure 8:
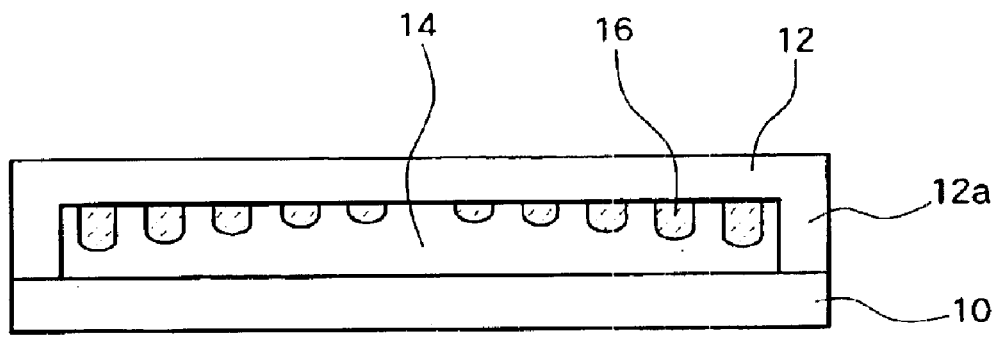
FIG. 8 is a cross sectional view schematically illustrating important part of a configuration of yet another embodiment according to the present invention.
Figure 9:
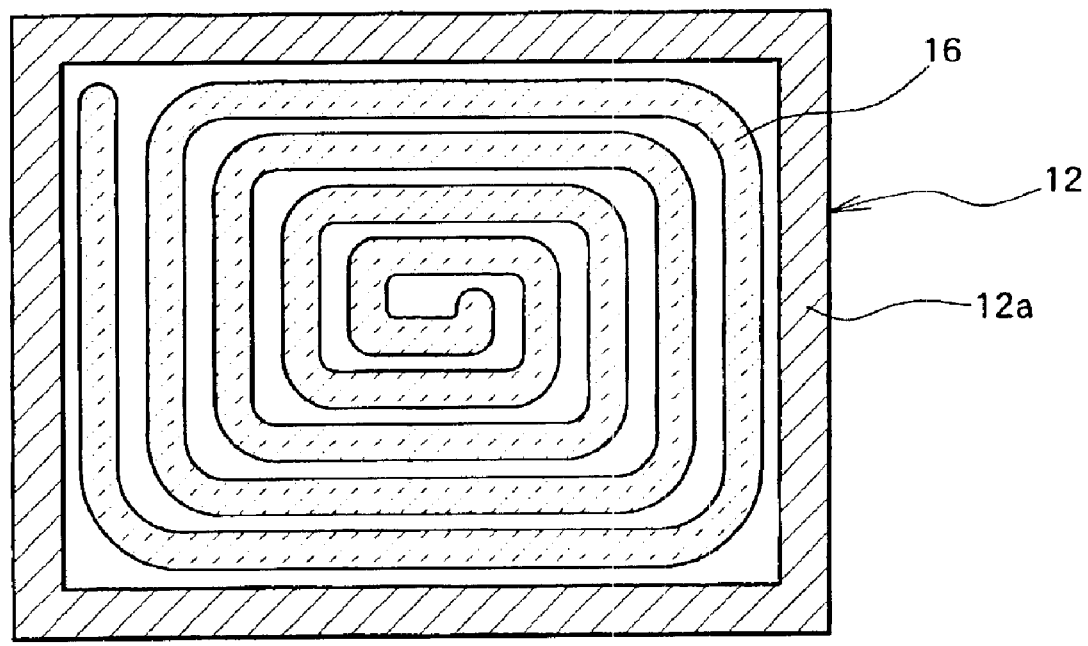
FIG. 9 is a front cross sectional view schematically illustrating a configuration of the embodiment illustrated in FIG. 8.

FIGS. 8 and 9 illustrate a further embodiment of the present invention. Referring to FIGS. 8 and 9, in this example the desiccant 16 is provided in a region of the sealing substrate 12 facing the display area 10a, i.e. substantially over the entire surface of the substrate. The thickness of the desiccant 16 in the central region, i.e. the region facing the display area 10a, is reduced as compared with that of the desiccant 16 located near the frame 12a of the sealing substrate 12. As illustrated in FIG. 9, the desiccant 16 is continuously provided in a convoluted pattern, wound from the central region side to the peripheral portion side of the sealing substrate 12 a plurality of times, with its thickness reduced toward the central region. Because the desiccant 16 is also provided in the central region in this example, such a configuration leads to a higher possibility of bringing the desiccant 16 and the EL substrate 10 into contact with each other in the central region than the configurations in FIG. 1A and FIG. 4 wherein no desiccant 16 is provided in the central region. The possibility of contact is, however, minimized because the thickness of the desiccant 16 is decreased as it approaches the central region. On the other hand, it is possible to exert sufficient moisture absorbing function in the inner region 14 because the desiccant 16 is also provided in the central region.

Although the pattern of the desiccant 16 is not limited to a pattern as illustrated in FIG. 9, the pattern shown in FIG. 9 is very effective for maximizing the surface area of the desiccant 16 while decreasing its thickness in the central region. As described above, a configuration wherein the desiccant 16 is provided in substantially the entire region of the sealing substrate 12 with the exception of the sealing portion is not appropriate for top emission type organic EL display devices for the above-described reasons, but such a configuration can simultaneously meet the demands of achieving a high moisture absorption and preventing contact between the desiccant and the display area 10a in bottom emission type organic EL display devices for emitting light to outside from the EL substrate 10 side. It should be noted that a continuous spiral pattern is not necessary when a sticker type desiccant is attached as described above, and the independently patterned desiccants 16 as illustrated in FIG. 6 may be uniformly arranged in a matrix from the peripheral region to the central region. Naturally, the thickness of the desiccant 16 located in the central region must still be less then the thickness in the peripheral region.

The spiral pattern desiccant 16 provided over substantially the entire surface, or only in the peripheral portion, of the sealing substrate described above is preferably applied from a central side end toward the peripheral portion. Particularly in the pattern of FIGS. 8 and 9 where the desiccant 16 is also provided in the central region of the substrate, the desiccant must be applied from the central portion of the substrate in an outwardly extending pattern. At the terminating end of the discharged pattern, because the tip of the application tube (nozzle of the application device) is removed from the sealing substrate 12, the applied desiccant tends to be thicker than in the remaining portions. As a result, the desiccant 16 is applied beginning with the central area of the substrate to ensure that thickness of the desiccant is minimized in the central portion.

As described above, in the embodiments according to the present invention, the thickness of the moisture absorbent in the inner region is reduced, so that a large distance between the EL substrate and the sealing substrate can be maintained. While the moisture absorbent is disposed in the outer region, deformation is small in this region, thereby efficiently preventing contact between the moisture absorbent and the EL substrate due to flexure.

What is claimed is:

1. An organic electroluminescence panel, comprising:
   an electroluminescence substrate having a plurality of organic electroluminescence pixels formed thereon;
   a sealing substrate disposed opposite to said electroluminescence substrate, and having a peripheral portion connected to a peripheral portion of said electroluminescence substrate, and an inner region covering a pixel region where said plurality of organic electroluminescence pixels are formed, said inner region separated from said pixel region by a predetermined distance; and
   a moisture absorbent applied on an upper surface of the inner region of said sealing substrate; wherein
   said moisture absorbent is provided with a thickness smaller in a region distant from said peripheral portion than in a region near said peripheral portion in the upper surface of said inner region.

2. An organic electroluminescence panel according to claim 1, wherein
   said sealing substrate is a concave substrate projecting in the peripheral portion bonded to said electroluminescence substrate, and depressed in the inner region corresponding to said pixel region of said electroluminescence substrate.

3. An organic electroluminescence panel according to claim 1, wherein
   said moisture absorbent is provided in both regions corresponding to a region near said peripheral portion and to a central portion of said electroluminescence substrate, and having a thickness reduced toward said central portion.

4. An organic electroluminescence panel according to claim 3, wherein
   said moisture absorbent is provided in a continuous spiral pattern extending from said central portion to said peripheral portion.

5. An organic electroluminescence panel, comprising:
   an electroluminescence substrate having a plurality of organic electroluminescence pixels formed thereon;
   a sealing substrate disposed opposite to said electroluminescence substrate, and having a peripheral portion connected to a peripheral portion of said electroluminescence substrate, and an inner region covering a pixel region where said plurality of organic electroluminescence pixels are formed, said inner region separated from said pixel region by a predetermined distance; and
   a moisture absorbent applied on an upper surface of the inner region of said sealing substrate; wherein
   said moisture absorbent is provided only in a region near said peripheral portion and is formed on a concave portion constituting the inner region,
   said sealing substrate is a concave substrate projecting in the peripheral portion bonded to said electroluminescence substrate, and depressed in the inner region corresponding to said pixel region of said electroluminescence substrate.

6. An organic electroluminescence panel, comprising:
   an electroluminescence substrate having a plurality of organic electroluminescence pixels formed thereon;
   a sealing substrate disposed opposite to said electroluminescence substrate, and having a peripheral portion connected to a peripheral portion of said electroluminescence substrate, and an inner region covering a pixel region where said plurality of organic electroluminescence pixels are formed, said inner region separated from said pixel region by a predetermined distance; and
   a moisture absorbent applied on an upper surface of the inner region of said sealing substrate; wherein
   said moisture absorbent is provided only in a region near said peripheral portion, and not provided in a region distant from said peripheral portion,
   said moisture absorbent provided on the upper surface of said sealing substrate has a thickness smaller in the region distant from said peripheral portion than in the region near said peripheral portion.

7. An organic electroluminescence panel according to claim 6, wherein the sealing substrate is a flat plate.

8. An organic electroluminescence panel according to claim 6, wherein
   said moisture absorbent is provided with a thickness which decreases further from said peripheral portion.

9. An organic electroluminescence panel according to claim 6, wherein
   said moisture absorbent is provided in a continuous spiral pattern extending from a central portion side of said electroluminescence substrate to said peripheral portion.

10. An organic electroluminescence panel, comprising:
    an electroluminescence substrate having a plurality of organic electroluminescence pixels formed thereon;
    a sealing substrate disposed opposite to said electroluminescence substrate, and having a peripheral portion connected to a peripheral portion of said electroluminescence substrate, and an inner region covering a pixel region where said plurality of organic electroluminescence pixels are formed, said inner region separated from said pixel region by a predetermined distance; and
    a moisture absorbent applied on an upper surface of the inner region of said sealing substrate; wherein
    said moisture absorbent is provided only in a region near said peripheral portion and is provided in a continuous spiral pattern extending from a central portion side of said electroluminescence substrate to said peripheral portion.

11. An organic electroluminescence panel according to claim 10, wherein the sealing substrate is a flat plate.

12. An organic electroluminescence panel, comprising:
    an electroluminescence substrate having a plurality of organic electroluminescence pixels formed thereon;
    a sealing substrate disposed opposite to said electroluminescence substrate, and having a peripheral portion connected to a peripheral portion of said electroluminescence substrate, and an inner region covering a pixel region where said plurality of organic electroluminescence pixels are formed, said inner region separated from said pixel region by a predetermined distance; and
    a moisture absorbent applied on an upper surface of the inner region of said sealing substrate; wherein
    said moisture absorbent is provided only in a region near said peripheral portion and is applied in a form of a continuous belt and two ends of the continuous belt are spaced apart from each other.

13. An organic electroluminescence panel according to claim 12, wherein the sealing substrate is a flat plate.

14. An organic electroluminescence panel, comprising:

an electroluminescence substrate having a plurality of organic electroluminescence pixels formed thereon;

a sealing substrate disposed opposite to said electroluminescence substrate, and having a peripheral portion connected to a peripheral portion of said electroluminescence substrate, and an inner region covering a pixel region where said plurality of organic electroluminescence pixels are formed, said inner region separated from said pixel region by a predetermined distance; and multiple moisture absorbents applied on an upper surface of the inner region of said sealing substrate, wherein said multiple moisture absorbents each having an individual pattern are arranged along the peripheral portion.

15. An organic electroluminescence panel according to claim 1, wherein the sealing substrate is a flat plate.

* * * * *